United States Patent
Wong et al.

(10) Patent No.: US 7,683,581 B2
(45) Date of Patent: Mar. 23, 2010

(54) MEASURING APPARATUS AND METHOD FOR MEASURING REMAINING COULOMBS OF ELECTRICAL ENERGY STORAGE DEVICE AND ELECTRONIC DEVICE

(75) Inventors: Shih-Fang Wong, Taipei Hsien (TW); Jun Li, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 393 days.

(21) Appl. No.: 11/733,208

(22) Filed: Apr. 10, 2007

(65) Prior Publication Data
US 2008/0077338 A1 Mar. 27, 2008

(30) Foreign Application Priority Data
Sep. 26, 2006 (CN) .................. 2006 1 0200916

(51) Int. Cl.
*H01M 10/46* (2006.01)
(52) U.S. Cl. ..................................... 320/132
(58) Field of Classification Search ................ 320/107, 320/132, 149, DIG. 12; 324/426, 430, 433
See application file for complete search history.

(56) References Cited

U.S. PATENT DOCUMENTS

| | | | |
|---|---|---|---|
| 5,587,660 | A | 12/1996 | Chabbert et al. |
| 6,252,377 | B1 | 6/2001 | Shibutani et al. |
| 6,359,419 | B1 * | 3/2002 | Verbrugge et al. .......... 320/132 |
| 6,897,635 | B2 | 5/2005 | Ozawa et al. |
| 7,397,217 | B2 * | 7/2008 | Van Brocklin et al. ...... 320/149 |
| 2002/0030494 | A1 | 3/2002 | Araki et al. |

(Continued)

FOREIGN PATENT DOCUMENTS

CN 03113577.3 C 12/2004

(Continued)

OTHER PUBLICATIONS

Xue-Geng Gong et al. ,researching the model and estimated strategy of SOC for a power battery of an electric vehicle,Chinese Journal of Power Source,Oct. 31, 2004,633-636,28-10,Chinese academic Journal Electronic Publishing House,CN.

(Continued)

*Primary Examiner*—Edward Tso
(74) *Attorney, Agent, or Firm*—Frank R. Niranjan

(57) ABSTRACT

A measuring apparatus includes a storing module, a measuring module, and a processing module. The storing module is used for storing maximum coulombs of the rechargeable electrical energy storage device, and a relation of various standard voltage and percentages of the remaining coulombs to the maximum coulombs. The measuring module is used for measuring an initial voltage of the rechargeable electrical energy storage device, and retrieving initial charged coulombs from the storing module. The processing module is used for calculating charged coulombs and discharged coulombs, and calculating the remaining coulombs of the rechargeable electrical energy storage device based on the charged coulombs or the discharged coulombs and the initial charged coulombs and updating the storing module with the remaining coulombs. A measuring method and an electronic device including a measuring apparatus for measuring the remaining coulombs are also disclosed.

14 Claims, 4 Drawing Sheets

U.S. PATENT DOCUMENTS

2002/0109506 A1* 8/2002 Kawakami et al. ........ 324/522
2002/0117997 A1* 8/2002 Feil et al. .................. 320/132

FOREIGN PATENT DOCUMENTS

| CN | 1565067 A | 1/2005 |
|---|---|---|
| JP | 2004-361313 A | 12/2004 |
| WO | 2005116675 A1 | 12/2005 |

OTHER PUBLICATIONS

Yong Lu et al. ,researching the model of SOC for an Ni-MH battery used in an electric vehicle,Journal of Chinese Battery Industry,Oct. 31, 2006,307-310,11-5,Chinese academic Journal Electronic Publishing House,CN.

Guo-Guang Qi et al. ,researching the measuring technology of battery capacity for electric vehicles,Journal of Tsinghua University (Sci&Tech),Mar. 31, 1997,46-49,37-3,Chinese academic Journal Electronic Publishing House,CN.

* cited by examiner

| voltages (V) | 4.20 | 4.06 | 3.98 | 3.92 | 3.87 | 3.82 | 3.79 | 3.77 | 3.74 | 3.68 | 3.45 |
|---|---|---|---|---|---|---|---|---|---|---|---|
| percentages | 100% | 90% | 80% | 70% | 60% | 50% | 40% | 30% | 20% | 10% | 5% |

FIG. 2

MEASURING APPARATUS AND METHOD FOR MEASURING REMAINING COULOMBS OF ELECTRICAL ENERGY STORAGE DEVICE AND ELECTRONIC DEVICE

BACKGROUND OF THE INVENTION

1. Field of the Invention

The present invention generally relates to methods and apparatuses for measuring remaining coulombs of electrical energy storage devices, and more particularly to a measuring method and a measuring apparatus for measuring remaining coulomb of a rechargeable battery charge in an electronic device.

2. Description of Related Art

Electrical energy storage devices, especially rechargeable batteries, such as nickel-hydrogen storage batteries, lithium-ion batteries, etc., are widely used as power sources for various electronic devices. After a rechargeable battery has been fully charged, a maximum coulomb is obtained. When the charged battery discharges over a time interval, the maximum coulomb decreases to a remaining coulomb. If the remaining coulomb is too small, an electronic device using the rechargeable battery as a power source may not work. Therefore, it is required to timely measure the remaining coulomb of the rechargeable battery.

Currently, two conventional methods for measuring the remaining coulomb are used, i.e., a current integrating method and a terminal voltage measuring method.

The current integrating method generally includes following steps of: storing an initial charged coulomb of a charged battery; discharging the charged battery; taking the integral of a discharging current to calculate a discharged coulomb; and identifying the remaining coulomb by subtracting the discharged coulomb from the initial charged coulomb. However, internal chemistry reactions exist in the charged battery. The internal chemistry reactions leads to self-discharges in the charged battery, the initial charged coulomb is thus inaccurate. Therefore, it is difficult to get an accurate remaining coulomb based on the inaccurate initial charged coulomb.

The voltage measuring method includes following steps: detecting relationships of various standard voltages of the rechargeable battery and corresponding standard remaining capacities, and storing the relationships in a rechargeable battery before marketing; measuring an actual voltage of a load which is connected to the rechargeable battery; and determining an actual remaining coulomb corresponding to the measured actual voltage according to the relationship of voltages and capacities. However, there are also two factors influencing a veracity of the measured voltage. One factor is that an actual measured voltage of the load is only part of an ideal measured voltage, and the other part of the ideal measured voltage is skewed by the rechargeable battery itself due to an essential resistance thereof. Therefore, according to the relationships of voltages and capacities, the remaining coulomb corresponding to the actual measured voltages is less than an ideal charge corresponding to the ideal measured voltage. The other factor is that the rechargeable battery is gradually worn out by repeating charges and discharges, so that the relationships of voltages and capacities are variational. Therefore, it is also inaccurate to use the voltage measuring method to measure the remaining coulomb.

Therefore, a measuring method and a measuring apparatus for measuring remaining coulomb are needed in the industry to address the aforementioned deficiencies and inadequacies.

SUMMARY OF THE INVENTION

A measuring apparatus is used for measuring a remaining coulomb of a rechargeable electrical energy storage device. The measuring apparatus includes a storing module, a measuring module, and a processing module. The storing module is used for storing data on relations between voltage and charge of the rechargeable electrical energy storage device. The measuring module is used for measuring an initial voltage of the rechargeable electrical energy storage device, and obtaining an initial charged coulomb based on the data. The processing module is used for calculating a charged coulomb and a discharged coulomb, and calculating the remaining coulomb based on the charged coulomb or the discharged coulomb and the initial charged coulomb and updating the data with the remaining coulomb. A measuring method and an electronic device including a measuring apparatus for measuring a remaining coulomb are also disclosed.

An electronic device includes a rechargeable electrical energy storage device and a measuring apparatus. The measuring apparatus is for measuring a remaining coulomb of the rechargeable electrical energy storage device. The measuring apparatus includes a storing module, a measuring module, and a processing module. The storing module is for storing data on relations between voltage and charge of the rechargeable electrical energy storage device. The measuring module is for measuring an initial charged coulomb of the rechargeable electrical energy storage device based on the data. The processing module is for calculating a charged coulomb and a discharged coulomb, and calculating the remaining coulomb based on the charged coulomb or the discharged coulomb and the initial charged coulomb and updating the data with the remaining coulomb.

A measuring method is for measuring remaining coulomb of a rechargeable electrical energy storage device. The measuring method includes following steps: measuring a first voltage; compensating the first voltage with a first voltage compensation; identifying the initial charged coulomb according to the first voltage; taking the integral of a current to calculate a value; determining that the electrical energy storage device is in the charging state or the discharging state; calculating the remaining coulomb by subtracting the value from the initial charged coulomb of the electrical energy storage device before discharging.

Other systems, methods, features, and advantages of the present measuring apparatus, the present electronic device and the present measuring method will be or become apparent to one with skill in the art upon examination of the following drawings and detailed description. It is intended that all such additional systems, methods, features, and advantages be included within this description, be within the scope of the present device, and be protected by the accompanying claims.

BRIEF DESCRIPTION OF THE DRAWINGS

Many aspects of the present measuring apparatus, the present electronic device and the present measuring method can be better understood with reference to the following drawings. The components in the drawings are not necessarily to scale, emphasis instead being placed upon clearly illustrating the principles of the present device. Moreover, in the drawings, like reference numerals designate corresponding parts throughout the several views.

FIG. 2 is a reference table of the measuring apparatus of FIG. 1;

DETAILED DESCRIPTION OF THE INVENTION

Reference will now be made to the drawings to describe a preferred embodiment of the present measuring method, and a preferred embodiment of the present measuring apparatus.

Figure 1:
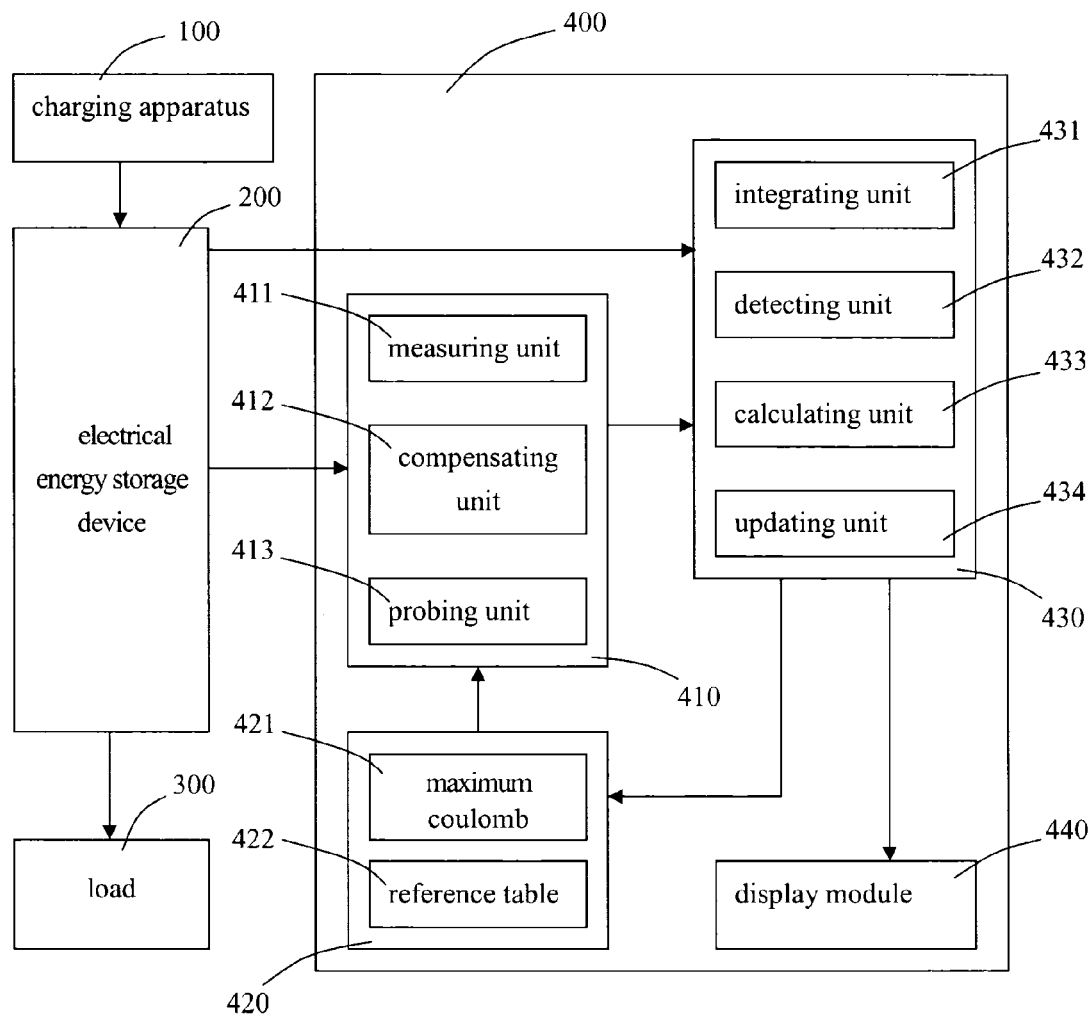
FIG. 1 is a block diagram showing a measuring apparatus in accordance with an exemplary embodiment.

Referring to FIG. 1, a measuring apparatus 400 is used for measuring a remaining coulomb of a rechargeable electrical energy storage device 200. The electrical energy storage device 200 is electrically connected to a charging apparatus 100, a load 300, and the measuring apparatus 400. The charging apparatus 100 is used in a charging procedure, so as to charge the electrical energy storage device 200. During the charging procedure, the electrical energy storage device 200 has a charging current. The load 300 is used for consuming electrical energy stored in the electrical energy storage device 200 during a discharge procedure. During the discharging procedure, the electrical energy storage device 200 has a discharging current. The electrical energy storage device 200 can be a rechargeable battery in this embodiment.

The measuring apparatus 400 includes a measuring module 410, a storing module 420, a processing module 430, and a display module 440. The measuring module 410 is used for measuring an initial charged coulomb of the electrical energy storage device 200. The storing module 420 is used for storing a maximum coulomb 421 and a reference table 422. The processing module 430 is used for calculating a remaining coulomb of the electrical energy storage device 200, and updating the maximum coulomb 421 and the reference table 422. The display module 440 is used for displaying the remaining coulomb. In the embodiment, the maximum coulomb 421 is denoted as $Q_{max}$. The initial charged coulomb is denoted as $Q_1$.

The maximum coulomb 421 refers to a charge stored in the electrical energy storage device 200 when fully charged. The reference table 422 shows a relationship of various voltages of the electrical energy storage device 200 and percentages of the remaining coulomb to the maximum coulomb 421 $Q_{max}$. In other embodiments, the reference table 422 may directly show a relationship of the voltages and the remaining coulombs. Referring to FIG. 2, a reference table 422 is illustrated to show the relation of the various voltages and the percentages under a normal temperature (20° C.) and a constant discharging current (550 mA) conditions.

The measuring module 410 includes a measuring unit 411, a compensating unit 412, and a probing unit 413. The measuring unit 411 is used for measuring a voltage between two nodes of the electrical energy storage device 200. The compensating unit 412 is used for obtaining a temperature of the electrical energy storage device 200 using an electronic thermometer, producing a voltage compensation based on the temperature to compensate the voltage and deduce a compensated voltage. The probing unit 413 is used for looking up the voltage in the reference table 422, and identifying a corresponding percentage that is denoted as n %. The probing unit 413 is also used for calculating the initial charged coulomb $Q_1$ in accordance with the following formula.

$$Q_1 = Q_{max} * n\%$$

The processing module 430 includes an integrating unit 431, a detecting unit 432, a calculating unit 433, and an updating unit 434. The integrating unit 431 is used for taking the integral of a charging current of the electrical energy storage device 200 so as to obtain a charged coulomb over a charging time interval, and also for taking the integral of a discharging current so as to obtain a discharged coulomb over a discharging time interval. For instance, a formula showing an integrating principle of the integrating unit 431 is illustrated as follows.

$$Q_2 = \int_0^T I(t)dt$$

where:

$Q_2$ represents the charged coulomb or the discharged coulomb;

I(t) represents a function of the charging current or the discharging current; and T represents the charging time interval or the discharging time interval.

The detecting unit 432 is used for detecting states of the electrical energy storage device 200, such as, a charging state or a discharging state. The calculating unit 433 is used for calculating the remaining coulombs according to following formulas and the integrated value Q1.

When charging:

$$Q3 = Q1 + Q2$$

When discharging:

$$Q3 = Q1 - Q2$$

Wherein Q3 represents the remaining coulombs and Q1 represents the initial charged coulombs of the electrical energy storage device 200.

The display module 440 is electrically connected to the processing module 430, and is used to display the remaining coulomb $Q_3$.

The updating unit 434 is used for updating the maximum coulomb 421 and the reference table 422 with the remaining coulomb and the voltage that is compensated with the voltage compensation.

Thus, the initial charged coulomb can be provided from the storing module 420 promptly without being influenced by the essential resistance. While discharging, the measuring apparatus 400 calculates the remaining coulomb based on the initial charged coulomb. As a result, since the initial charged coulomb mentioned above is accurate, an accurate remaining coulomb can be obtained.

Figure 3:
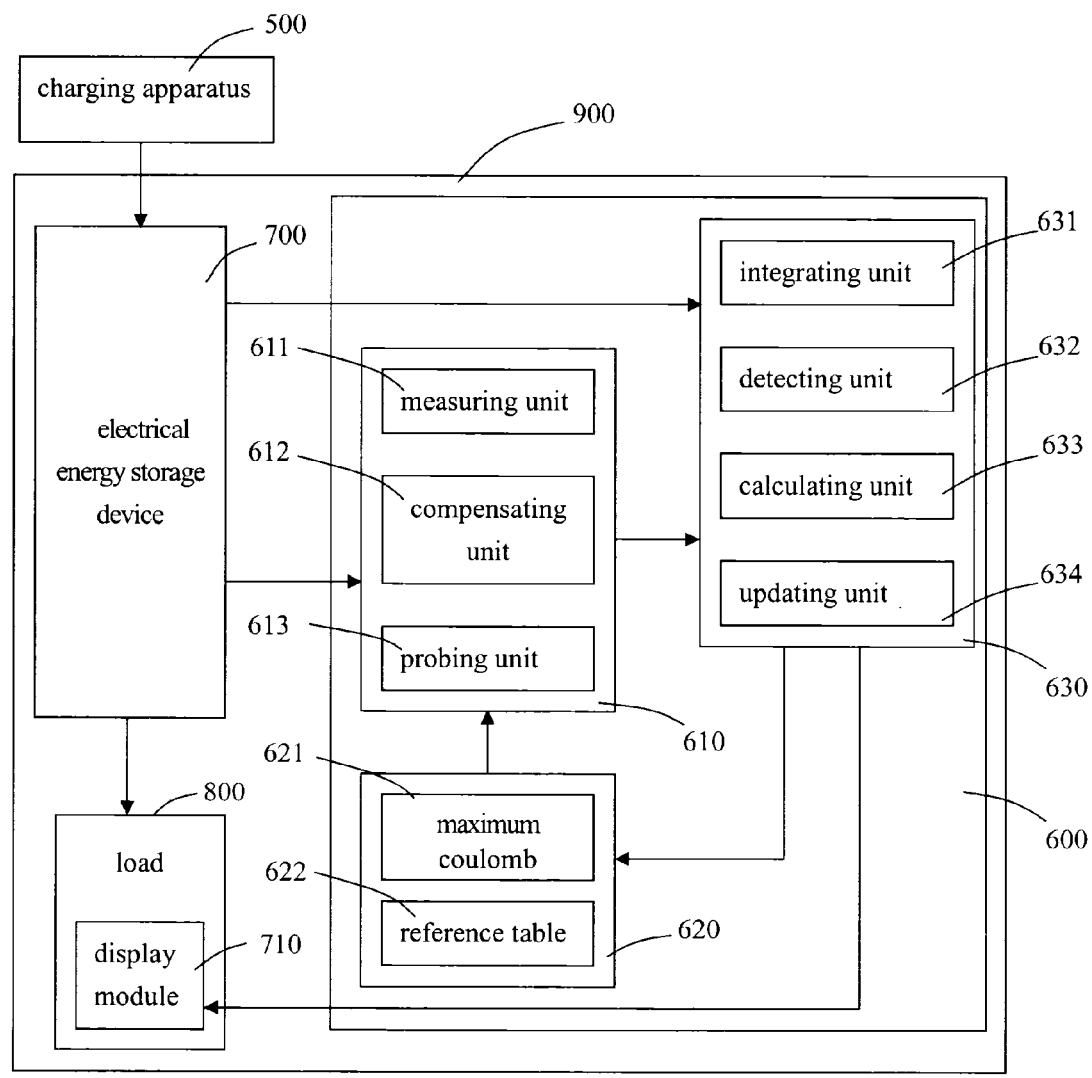
FIG. 3 is a block diagram of an electronic device in accordance with an exemplary embodiment.

Referring to FIG. 3, an electronic device 900 can be charged by a charging apparatus 500. The electronic device 900 includes a measuring apparatus 600, an electrical energy storage device 700, and a load 800. The measuring apparatus 600 has a similar structure of the measuring apparatus 400. The measuring apparatus 600 includes a measuring module 610, a storing module 620, and a processing module 630. A display module 710 is included in the load 800.

Figure 4:
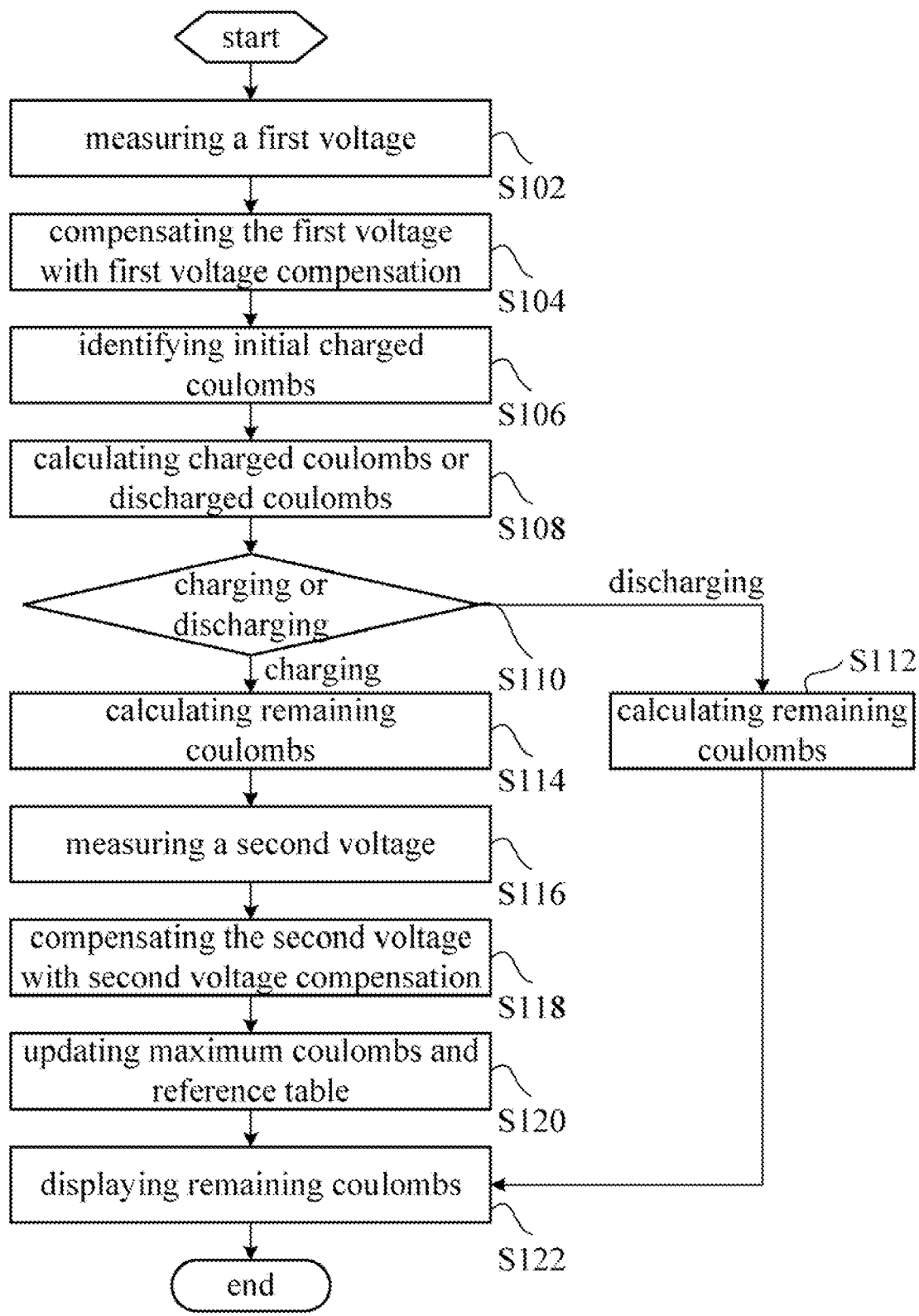
FIG. 4 is a process flow diagram illustrating a measuring method in accordance with an exemplary embodiment.

Referring to FIG. 4, a process flow diagram in accordance with an exemplary embodiment illustrates a procedure of a measuring method for measuring remaining coulomb of an electrical energy storage device using the measuring apparatus 400. The procedure includes the following steps.

In step S102, the measuring unit 411 measures a first voltage of the electrical energy storage device 200.

In step S104, the compensating unit 412 obtains the temperature of the electrical energy storage device 200, identifies a first voltage compensation, and compensates the first voltage with the first voltage compensation.

In step S106, the probing unit 413 identifies the initial charged coulomb according to the compensated first voltage.

In step S108, the integrating unit 431 calculates the charged coulomb or the discharged coulomb by taking the integral of the charging current or the discharging current.

In step S110, the detecting unit 432 detects the states of the electrical energy storage device 200 to determine that the electrical energy storage device 200 is in the charging state or the discharging state.

In step S112, if the electrical energy storage device 200 is in the discharging state, the calculating unit 433 calculates the remaining coulomb by subtracting the discharged coulomb from the initial charged coulomb, and the procedure goes to step S122.

In step S114, if the electrical energy storage device 200 is in the charging state, the calculating unit 433 calculates the remaining coulomb by adding the charged coulomb to the initial charged coulomb.

In step S116, the measuring unit 411 measures a second voltage of the electrical energy storage device 200.

In step S118, the compensating unit 412 obtains the temperature of the electrical energy storage device 200, identifies a second voltage compensation, and compensates the second voltage with the second voltage compensation.

In step S120, the updating unit 434 updates the maximum coulomb 421 with a new maximum coulomb calculated on the remaining coulomb and its corresponding percentage in the reference table 420, and updates a voltage in the reference table 420 corresponding to the remaining coulomb with the second voltage after being compensated.

In step S122, the display module 440 displays the remaining coulomb.

It should be emphasized that the above-described preferred embodiment, is merely a possible example of implementation of the principles of the invention, and is merely set forth for a clear understanding of the principles of the invention. Many variations and modifications may be made to the above-described embodiment of the invention without departing substantially from the spirit and principles of the invention. All such modifications and variations are intended to be included herein within the scope of this disclosure and the present invention and be protected by the following claims.

What is claimed is:

1. A measuring apparatus for measuring remaining coulombs of a rechargeable electrical energy storage device, the measuring apparatus comprising:
a storing module for storing maximum coulombs of the rechargeable electrical energy storage device, and a relation of various standard voltages of the rechargeable electrical energy storage device and percentages of the remaining coulombs to the maximum coulombs;
a measuring module for measuring an initial voltage of the rechargeable electrical energy storage device, and retrieving initial charged coulombs from the storing module; and
a processing module for calculating charged coulombs and discharged coulombs, calculating the remaining coulombs based on the charged coulombs or the discharged coulombs and the initial charged coulombs, and updating the storing module with the remaining coulombs.

2. The measuring apparatus according to claim 1, wherein the measuring module comprises a measuring unit for measuring a first voltage of the rechargeable electrical energy storage device.

3. The measuring apparatus according to claim 2, wherein the measuring module comprises a compensating unit for sensing a temperature of the rechargeable electrical energy storage device, identifying a first voltage compensation according to the temperature, and compensating the first voltage with the first voltage compensation.

4. The measuring apparatus according to claim 3, wherein the measuring module comprises a probing unit for identifying the initial charged coulombs according to the compensated first voltage.

5. The measuring apparatus according to claim 4, wherein the processing module comprises an integrating unit for taking the integral of a charging current of the rechargeable electrical energy storage device to obtain the charged coulombs, and taking the integral of a discharging current of the rechargeable electrical energy storage device to obtain the discharged coulombs.

6. The measuring apparatus according to claim 5, wherein the processing module comprises a detecting unit for detecting that a working state of the rechargeable electrical energy storage device is in a charging state or a discharging state.

7. The measuring apparatus according to claim 6, wherein the processing module comprises a calculating unit for calculating the remaining coulombs by subtracting the discharged coulombs from the initial charged coulombs of the electrical energy storage device before discharging, and calculating the remaining coulombs by adding the charged coulombs to the initial charged coulombs of the electrical energy storage device before charging.

8. The measuring apparatus according to claim 7, wherein the measuring unit measures a second voltage of the rechargeable electrical energy storage device, the compensating unit compensates the second voltage with a second voltage compensation, and the processing module comprises an updating unit for updating the maximum coulombs with new maximum coulombs calculated based on the remaining coulombs and a voltage corresponding to the remaining coulombs with the compensated second voltage stored in the storing module.

9. The measuring apparatus according to claim 1, further comprising a display module for displaying the remaining coulombs.

10. An electronic device comprising:
a rechargeable electrical energy storage device;
a measuring apparatus for measuring remaining coulombs of the rechargeable electrical energy storage device, the measuring apparatus comprising:
a storing module for storing maximum coulombs of the rechargeable electrical energy storage device, and a relation of various standard voltage of the rechargeable electrical energy storage device and percentages of the remaining coulombs to the maximum coulombs;
a measuring module for measuring an initial voltage of the rechargeable electrical energy storage device, and retrieving initial charged coulombs from the storing module; and
a processing module for calculating charged coulombs and discharged coulombs, calculating the remaining coulombs based on the charged coulombs or the discharged coulombs and the initial charged coulombs, and updating the storing module with the remaining coulombs.

11. A measuring method for measuring remaining coulombs of a rechargeable electrical energy storage device, the method comprising:
measuring a first voltage;
compensating the first voltage with a first voltage compensation;

identifying the initial charged coulombs according to the first voltage;

taking the integral of a current to calculate a value;

determining that the electrical energy storage device is in the charging state or the discharging state;

calculating the remaining coulombs by subtracting the value from the initial charged coulombs of the electrical energy storage device before discharging;

measuring a second voltage;

compensating the second voltage with a second voltage compensation; and updating the maximum coulombs with new maximum coulombs calculated on the remaining coulombs and a voltage corresponding to the remaining coulombs with the compensated second voltage in the storing module.

12. The measuring method according to claim 11, further comprising:

displaying the remaining coulombs.

13. The measuring method according to claim 12, further comprising:

calculating the remaining coulombs by adding the value to the initial charged coulombs at an occurrence of the rechargeable electrical energy storage device is in the charging state.

14. The electronic device according to claim 10, wherein the measuring module measures a second voltage of the rechargeable electrical energy storage device, the measuring module comprises a compensating unit for compensating the second voltage with a second voltage compensation, and the processing module comprises an updating unit for updating the maximum coulombs with new maximum coulombs calculated based on the remaining coulombs and a voltage corresponding to the remaining coulombs with the compensated second voltage stored in the storing module.

* * * * *